United States Patent [19]

Kobayashi

[11] Patent Number: 5,708,797
[45] Date of Patent: Jan. 13, 1998

[54] IC MEMORY WITH DIVISIONAL MEMORY PORTIONS

[75] Inventor: Yuji Kobayashi, Kanagawa, Japan

[73] Assignee: Sony Corporation, Tokyo, Japan

[21] Appl. No.: 586,375

[22] Filed: Jan. 17, 1996

[30] Foreign Application Priority Data

Jan. 28, 1995 [JP] Japan ..................... 7-031744

[51] Int. Cl.$^6$ ............... H01L 27/108; G06F 12/02
[52] U.S. Cl. ............... 395/497.04; 395/497.02; 395/428
[58] Field of Search ............... 395/428, 429, 395/430, 431, 432, 497.01, 497.02, 497.03, 497.04; 365/230.03

[56] References Cited

U.S. PATENT DOCUMENTS

| | | | |
|---|---|---|---|
| 3,686,640 | 8/1972 | Anderson et al. | 395/497.04 |
| 4,482,984 | 11/1984 | Oritani | 365/154 |
| 4,876,670 | 10/1989 | Nakayabashi et al. | 365/194 |
| 5,212,666 | 5/1993 | Takeda | 365/230.03 |
| 5,307,316 | 4/1994 | Takemae | 365/200 |
| 5,379,257 | 1/1995 | Matsumura et al. | 365/189.01 |
| 5,388,073 | 2/1995 | Usami et al. | 365/230.03 |
| 5,566,127 | 10/1996 | Hoshizaki | 365/230.06 |
| 5,625,797 | 4/1997 | Ferry et al. | 395/497.04 |

*Primary Examiner*—Tod R. Swann
*Assistant Examiner*—Conley B. King, Jr.
*Attorney, Agent, or Firm*—Jay H. Maioli

[57] ABSTRACT

An IC (integrated circuit) memory is made by using a chip of a minimum size that can accommodate memory of a desired capacity. Specifically, the chip has the size of (6.33× 6.34) mm$^2$, and its effective chip size is (4.33×4.43) mm$^2$ 1-port RAM (random access memory) 1 of 792w (word length)×24 bits (bit width), 1-port RAM 2 of 220w×24 bits, and a logic circuit having about 3,000 gates for controlling these RAMs are provided in the effective chip size.

6 Claims, 10 Drawing Sheets

Fig. 2 (PRIOR ART)

| CONFIGURATIONS OF RAM | | ACTUAL SIZE (mm) | |
|---|---|---|---|
| WORD LENGTH | BIT WIDTH | WORD DIRECTION | BIT DIRECTION |
| 910 | 24 | 6.24 | 2.93 |
| : | 20 | : | 2.54 |
| : | 12 | : | 1.77 |
| : | 10 | : | 1.58 |
| 864 | 24 | 5.93 | 2.93 |
| : | 20 | : | 2.54 |
| : | 12 | : | 1.77 |
| : | 10 | : | 1.58 |
| 455 | 24 | 3.29 | 2.93 |
| : | 20 | : | 2.54 |
| : | 12 | : | 1.77 |
| : | 10 | : | 1.58 |
| 432 | 24 | 3.13 | 2.93 |
| : | 20 | : | 2.54 |
| : | 12 | : | 1.77 |
| : | 10 | : | 1.58 |
| 398 | 24 | 2.93 | 2.93 |
| : | 20 | : | 2.54 |
| : | 12 | : | 1.77 |
| : | 10 | : | 1.58 |
| 358 | 24 | 2.67 | 2.93 |
| : | 20 | : | 2.54 |
| : | 12 | : | 1.77 |
| : | 10 | : | 1.58 |

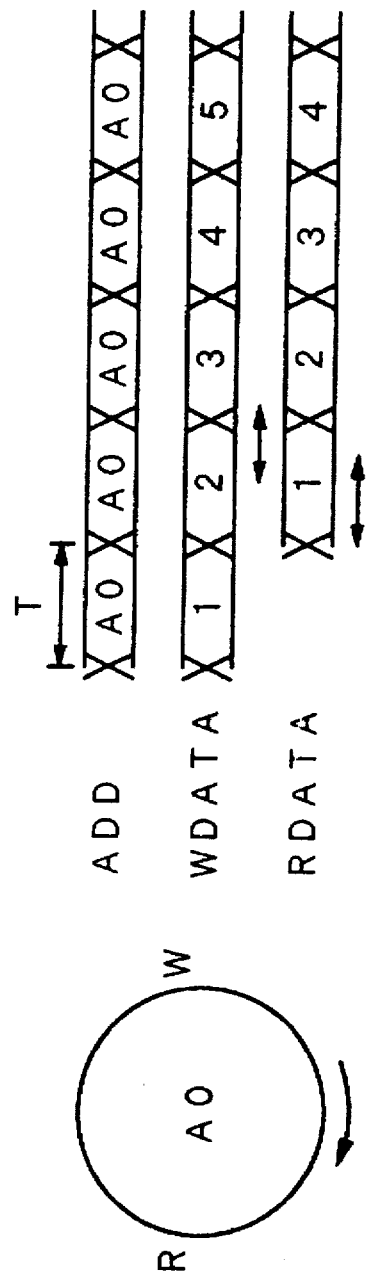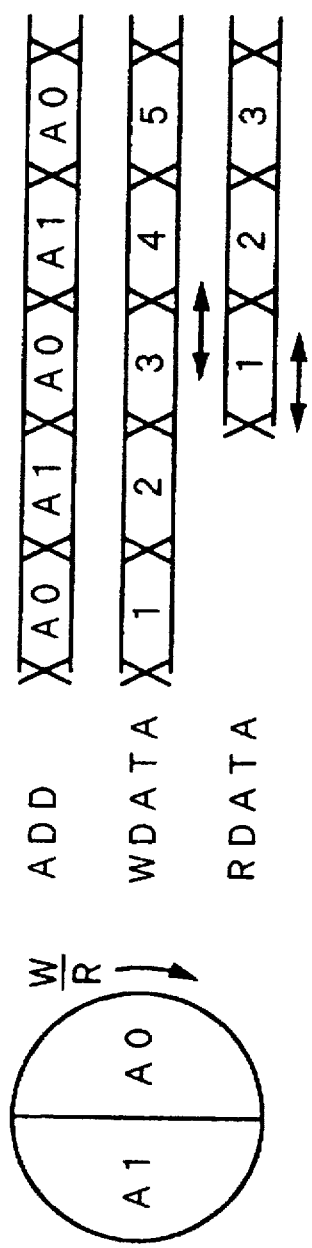

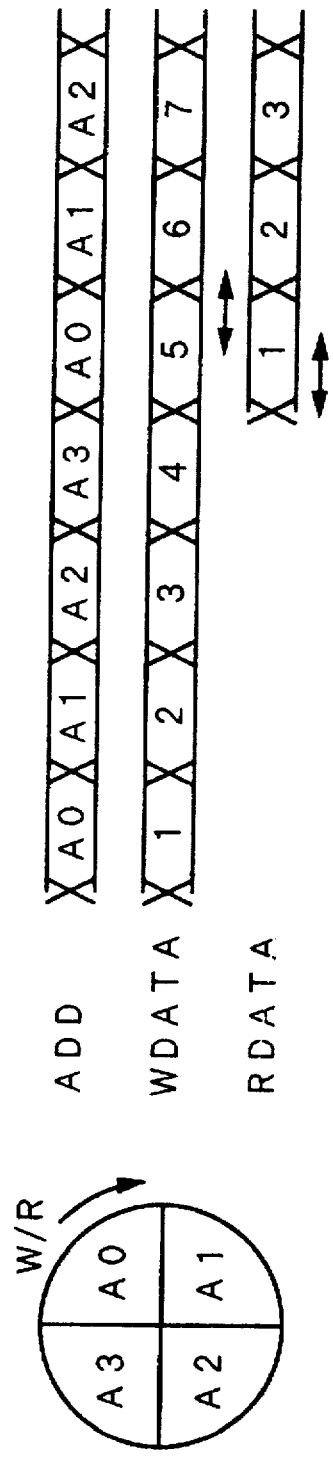
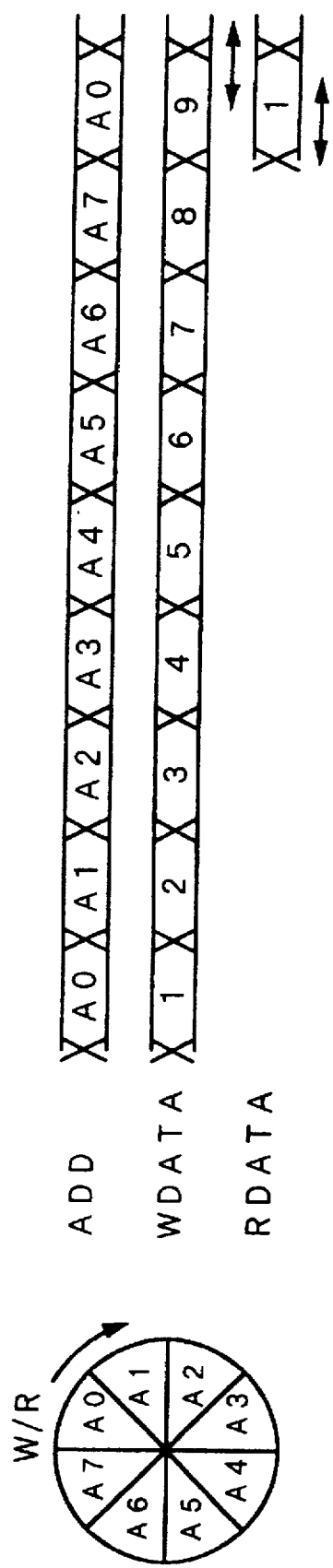

IC MEMORY WITH DIVISIONAL MEMORY PORTIONS

BACKGROUND OF THE INVENTION

1. Field of the Invention

This invention relates to an IC (integrated circuit) memory used as a line delay element for delaying a digital video signal, for example.

2. Description of the Prior Art

There is conventionally prepared a tool, called a compiled Cell, which can automatically create RAM (Random Access Memory), ROM (Read Only Memory), multiplier, and so forth, of desired capacities, when designing ICs (integrated circuits). That is, a compiled cell is used to automatically create RAM and ROM of desired capacities in the form of software by designating desired word lengths and bit widths.

When a desired word length and a bit width are designated as referred to above, longitudinal and transversal sizes of the physical configuration of the memory made on a chip are definitely determined. Since most chips have approximately square shapes, rectangular RAMs and ROMs do not fit well on these chips as explained below.

Although the maximum size of a chip acceptable in a package such as 64SQFP is 6.33×6.34 mm$^2$, its effective size is 4.33×4.43 mm$^2$ as shown in FIG. 1A because a certain area must be used for entry of signals, pads for the power source and wiring.

The term, 64SQFP, indicates a package for an IC having 64 pins, and particularly pertains to one having a lead pitch of 0.5 mm or less.

If a 2-port RAM of 910w (word length)×12 bits (bit width) is created in the effective chip size by a compiled cell, then the size of the RAM becomes as large as (6.24×1.77) mm$^2$ as shown in FIG. 1B. The word length, 910w, is an example of a word length in one line. The size of the 1-port RAM of 910w×12 bits becomes as large as (4.903×1.513) mm$^2$ as shown in FIG. 1C. The RAMs, thus created, have areas of 11.04 mm$^2$ and 7.42 mm$^2$, respectively, which are smaller than the area of 19.18 mm$^2$ of the effective chip size.

However, in order to incorporate such a RAM on a chip, the chip size must be large enough to accommodate the longer side of the RAM, and it is necessary to employ the chip size shown by the dotted line in FIGS. 1B and 1C, which is slightly larger than the effective chip size shown in FIG. 1A. Therefore, a great amount of dead space is produced in the area of the chip.

FIG. 2 shows actual sizes of RAMs having word lengths ranging from 910w to 358w and bit widths ranging from 10 bits to 24 bits. It is known from FIG. 2 that the size of the longer side of a RAM is determined by its word length. It is also known that the size of the longer side increases by 1.895 times to 1.897 times as the word length is doubled and that it increases by 1.608 times to 1.655 times as the bit width is doubled.

This is important, and means that the former (FIG. 1B) can be accommodated within the effective chip size of FIG. 1A by decreasing the word length, for example, to 455w in the example of FIG. 2 and that the latter (FIG. 1C) will become more efficient when united with some others into a big one (particularly in the direction of the bit width) than being made as an individual small-capacity RAM.

For constructing a digital signal processing circuit, a delay element (line memory) is an indispensable device in addition to the essential processing unit of the circuit. When actually designing the circuit, designers often find that this portion occupies a larger amount of hardware or there is no delay element that satisfies the desired specification. It is therefore desirable that delay elements have configurations easy to use.

Configurations for easier use are: being small; being available at a cost equivalent to or less than conventional delay elements; low power consumption; having a capacity not less than 2kw×12 bits; being operative at the speed of 27 MHz or higher; being capable of selecting a 1H/2H multiplex output (where H is the line delay); being capable of setting the amount of delay continuously and easily, and having a small minimum delay; being usable at a source voltage ranging from 3V to 5V; permitting asynchronous writing and reading (TBC mode); and so forth.

It has been tried to efficiently realize a circuit which has a capacity not less than 2kw×12 bits and can be divided such that a 1H/2H multiplex output is also obtained. Although the efficiency is improved by increasing the bit width as large as possible, it also causes an increase in scale of the control circuit portion and an increase in the amount of delay. Therefore, to realize the width of 12 bits requires a circuit of the bit width of 24 bits which is twice the target bit width.

Some schemes for realizing two memory elements of 910w×12 bits by using a 2-port RAM are shown in FIGS. 3A to 3D. FIG. 3A shows the area of 18.2832 mm$^2$ corresponding to 910w×24 bits, and FIG. 3B shows the area of 22.0896 mm$^2$ for (910w×12 bits)×2. FIG. 3C shows the area of 19.2794 mm$^2$ for (455w×24 bits)×2, and FIG. 3D shows the area of 23.2932 mm$^2$ for (455w×12 bits)×4. In examples of FIGS. 3C and 3D, address changeover is required. Therefore, the example of FIG. 3A is most efficient in terms of the area.

However, even this size does not fit in the effective chip size of FIG. 1A. Nevertheless, no more reduction in the total word length and in bit width is desirable, and no increase in the chip size is desirable. Then, a 1-port RAM is used in lieu of the 2-port RAM. Although the TBC mode cannot be realized with 1-port RAMs, they are flexible foe any desired word length. Flexibility in word length is more important in a system for common use of composite and component signals.

OBJECT AND SUMMARY OF THE INVENTION

Considering that a memory device for several lines cannot be accommodated in a chip, an object of the invention is to provide an inexpensive delaying IC memory comprising divisional memory portions made by dividing conventional memory such that the divisional memory portions can be accommodated in a square chip by using the area of a chip more efficiently than a conventional memory device of the same capacity.

The delaying IC memory according to the invention comprises a plurality of divisional memory portions made by dividing memory with a desired capacity (word length× bit width) in accordance with the chip size of the IC.

The delaying IC memory according to the invention includes means for switching signals in data input/output portions, and includes control means for controlling generation of addresses for respective divisional memory portions, writing and reading data on and from the respective memory portions.

In the delaying IC memory according to the invention, the entirety of the divisional memory portions behaves as a unit of memory with a desired capacity to continuously write and read data.

According to the invention, there is also provided a IC memory having a capacity determined by a word length and a bit width, comprising, a first memory portion and a second memory portion disposed on a chip having a length L1 in a first direction and a length L2 in a second direction, the first memory portion having a first word length not larger than the length L1 and having the bit width in the second direction, the second memory portion having the bit width in the first direction and having a second word length in the second direction, the sum of the bit width and the second word length being substantially equal to the length L2, and the sum of the first word length and the second word length being substantially equal to the word length.

The chip 4 in FIG. 4 has the minimum size that can accommodate a memory device of a desired capacity. That is, the size of the chip 4 is $(6.33 \times 6.34) mm^2$, and its effective size is $(4.33 \times 4.43) mm^2$. Formed in the effective chip size are two 1-port RAMs, namely, RAM 1 of 792w (word length)×24 bits (bit width) and RAM 2 of 220w×24 bits, and a logic circuit 3 having approximately 3,000 gates for controlling the RAMs.

The above, and other, objects, features and advantage of the present invention will become readily apparent from the following detailed description thereof which is to be read in connection with the accompanying drawings.

BRIEF DESCRIPTION OF THE DRAWINGS

FIG. 2 is a schematic diagram for explaining geometrical configurations of memory;

FIGS. 5A through 5D are schematic diagrams for explaining delaying operations according to an embodiment of the invention;

DETAILED DESCRIPTION OF THE PREFERRED EMBODIMENT

An embodiment of the invention is explained below with reference to FIG. 4. Numeral 4 denotes a chip accommodated in a package, namely 64SQFP (with the pitch of 0.5 mm), for example. The size of the chip 4 is the minimum one that can accommodate a memory with the desired capacity. That is the size of the chip 4 is $(6.33 \times 6.34) mm^2$, and the effective chip size is $(4.33 \times 4.43) mm^2$. Formed in the effective chip size are two 1-port RAMs, namely, RAM 1 of 792w (word length)×24 bits (bit width) and RAM 2 of 220w×24 bits, and a logic circuit 3 having approximately 3,000 gates for controlling the RAMs.

The peripheral region of the effective chip size is used for providing input and output pads, power source, grounding GND and wiring, and the region between two RAMs is used for wiring of signals. The transversal length of the memory size is determined by the word length of RAM 1, and the longitudinal length is determined by the bit width of RAM 1 plus the word length of RAM 2.

A delaying element using the 1-port RAMs according to the embodiment is explained with reference to FIGS. 5A through 5D. FIG. 5A shows one-clock delay, and FIG. 5B shows 2-clock delay. FIG. 5C shows 4-clock delay, and FIG. 5D shows 8-clock delay. In case of 4-clock delay (FIG. 5C), for example, the first word is written in address A0, and the word is read out from address A0 four clocks later. Four-clock delay is thus realized.

Since writing and reading cannot share a single clock, suitable control is necessary to periodically provide a different between the reading and writing operations (read-after-write). That is, a control is executed to perform reading in the former half of the sampling period T (for example, $T = 1/13.5$ MHz) and writing in the latter half. Actually, the system is in the state for reading data in all periods other than those in which writing is executed.

Since the read-after-write operation writes new data while reading the oldest data, a constant delay is provided by cyclically effecting the read-after-write operation. Additionally, by varying the intervals of generating addresses, the delay amount can be changed.

Figure 6A:
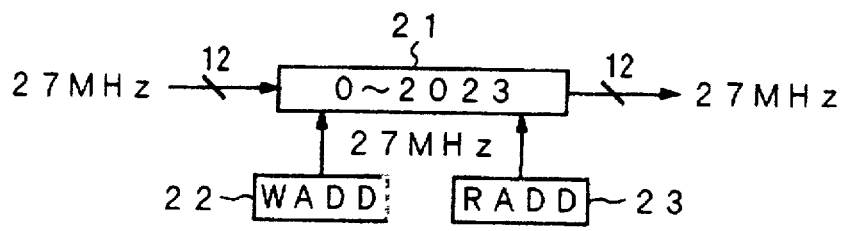
FIGS. 6A through 6C are block diagrams for explaining an embodiment of the invention.

Constructions of line memory using RAMs are explained below with reference to FIGS. 6A through 6C and FIG. 7. In FIG. 6A, numeral 21 is a 2-port RAM having the address of (0 to 2023). RAM 21 has the memory size of 2024w×12 bits. A digital signal (for example, a digital video signal) with the sampling frequency of 27 MHz is supplied to RAM 21. RAM 21 is also supplied with a write address signal from a write address generating circuit 22 and a read address signal from a read address generating circuit 23. A delayed digital signal is taken out from RAM 21.

By using the 2-port RAM shown in FIG. 6A, delay operation is readily realized by performing writing at the clock rate of the input data and simultaneously reading data of a different address. However, the use of the 2-port RAM is undesirable because it increases the memory size.

Figure 6B:
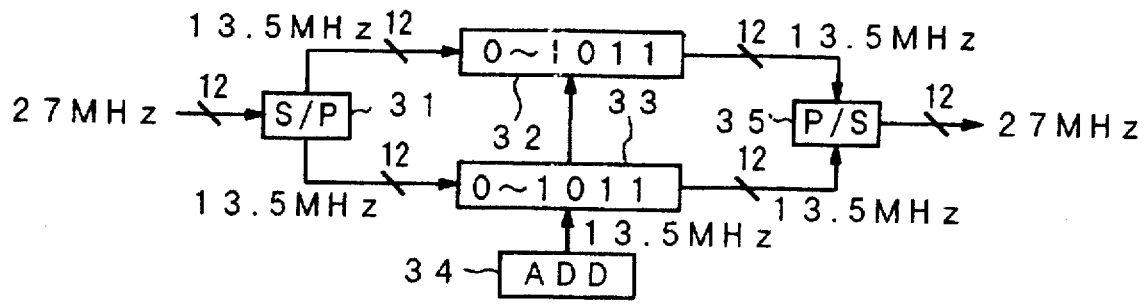

Another construction of line memory using a 1-port RAM is shown in FIG. 6B. In FIG. 6B, numerals 32 and 33 denote 1-port RAMs of 1012w×12 bits. A digital signal with the sampling frequency 27 MHz is supplied to RAM 32 and RAM 33 via a serial/parallel converting circuit 31. RAM 32 and RAM 33 are also supplied with an address signal from an address generating circuit 34. Outputs from the RAM 32 and RAM 33 are supplied to a parallel/serial converting circuit 35. A delayed digital signal is taken out from the parallel/serial converting circuit 35.

Digital signals whose data rate has been reduced into ½ (13.5 MHz) by the serial/parallel converting circuit 31 of FIG. 6B are alternately written in RAM 32 and RAM 33. Reading is performed by read-after-write described above, and data read out from RAMs are output, here again alternately, through the parallel/serial converting circuit 35. As a result, the digital signal of the original rate (27 MHz) is obtained. However, RAM 32 and RAM 33 of 1012w×12 bits cannot be realized on the chip size to be used in the embodiment. Therefore, the embodiment employs the construction of FIG. 6C in which RAM 32 and RAM 33, are divided.

Figure 6C:
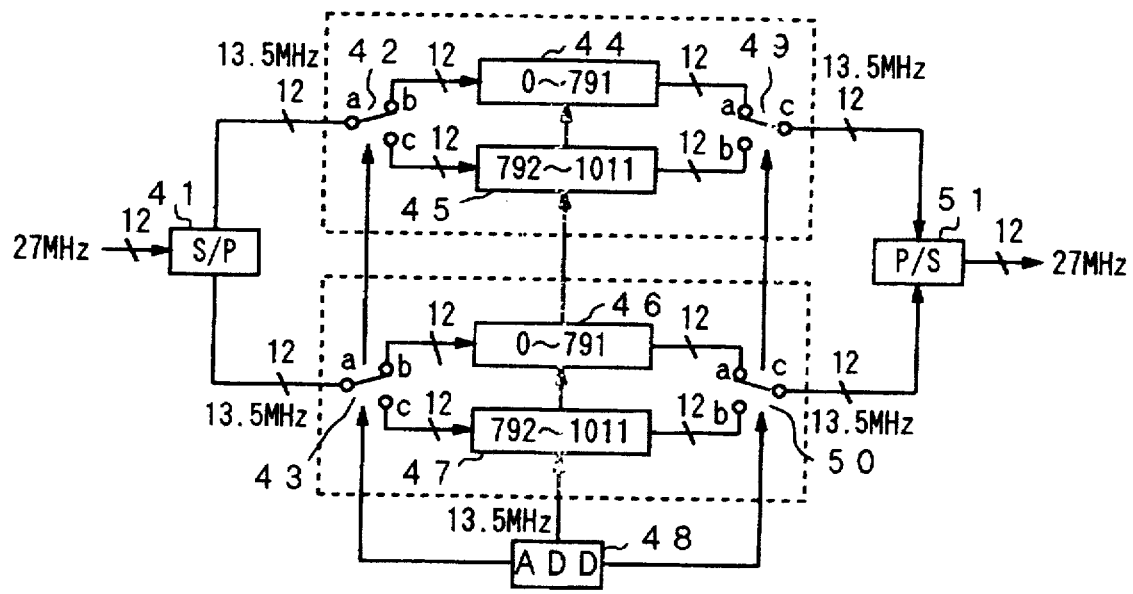

In FIG. 6C, a digital signal with the sampling frequency of 27 MHz is supplied to input terminals a of switches 42 and 43 via a serial/parallel converting circuit 41. Outputs from output terminals b of the switches 42 and 43 are supplied to RAM 44 and RAM 46 respectively. Outputs from output terminals c of the switches 42 and 43 are supplied to RAM 45 and RAM 47 respectively. An address signal from an address generating circuit 48 is supplied to RAMs 44, 45, 46 and 47, and a control signal from the address generating circuit 48 is supplied to switches 42, 43, 49 and 50.

Outputs from RAM 44 and RAM 46 are supplied to a parallel/serial converting circuit 51 through terminals a–c of the switches 49 and 50 respectively. Outputs from RAM 45 and RAM 47 are supplied to the parallel/serial converting circuit 51 through terminals b–c of the switches 49 and 50. A delayed digital signal is taken out from the parallel/serial converting circuit 51.

The arrangement of FIG. 6C is made by dividing RAM 32 of FIG. 6B into RAM 44 of 792w×12 bits and RAM 45 of 220w×12 bits and by dividing RAM 33 of FIG. 6B into RAM 46 of 792w×12 bits and RAM 47 of 220w×12 bits. The division can be realized by changing over switches 42, 43, 49 and 50. In this fashion, line memory can be made on the effective chip size as shown in FIG. 4.

Figure 1A:
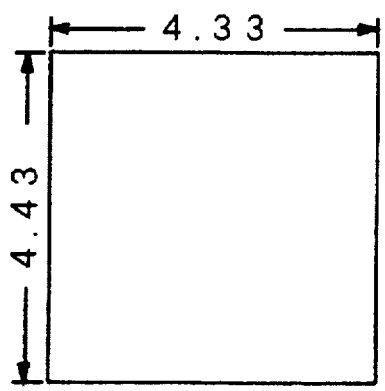
FIGS. 1A through 1C are schematic diagrams for explaining a geometrical relation between memory and a chip.
Figure 1B:
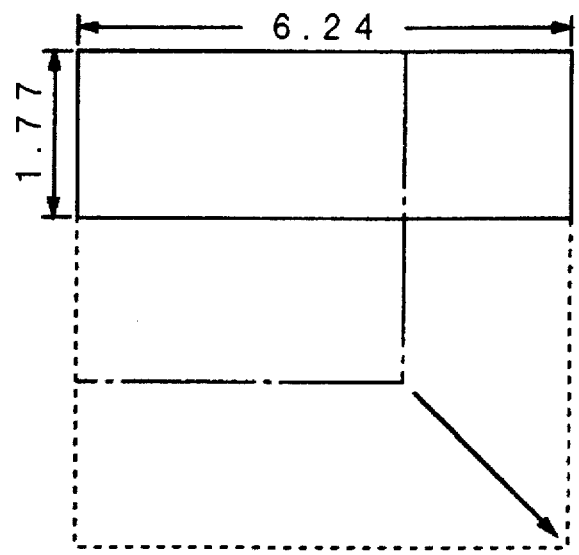
Figure 1C:
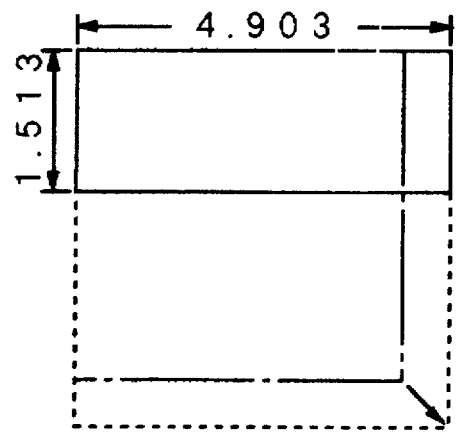
Figure 3A:
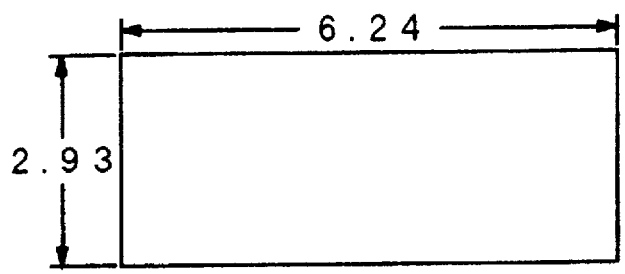
FIGS. 3A through 3D are schematic diagrams for explaining some geometrical versions of memory.
Figure 3B:
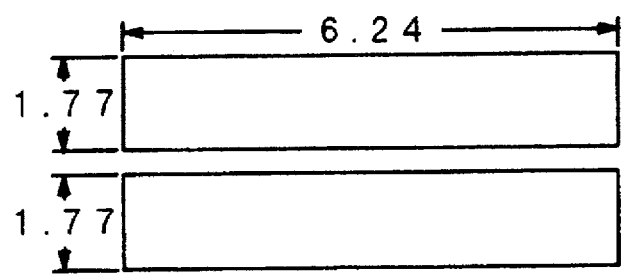
Figure 3C:
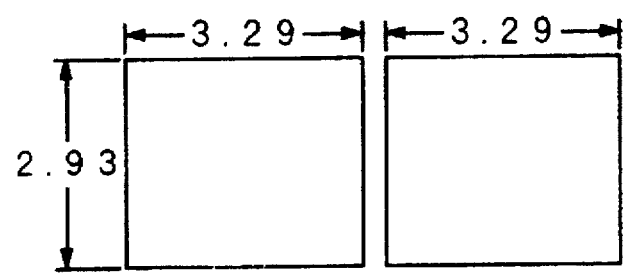
Figure 3D:
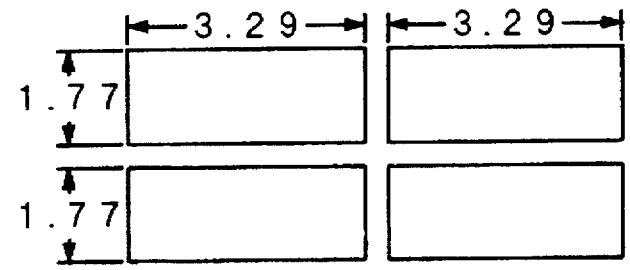
Figure 4:
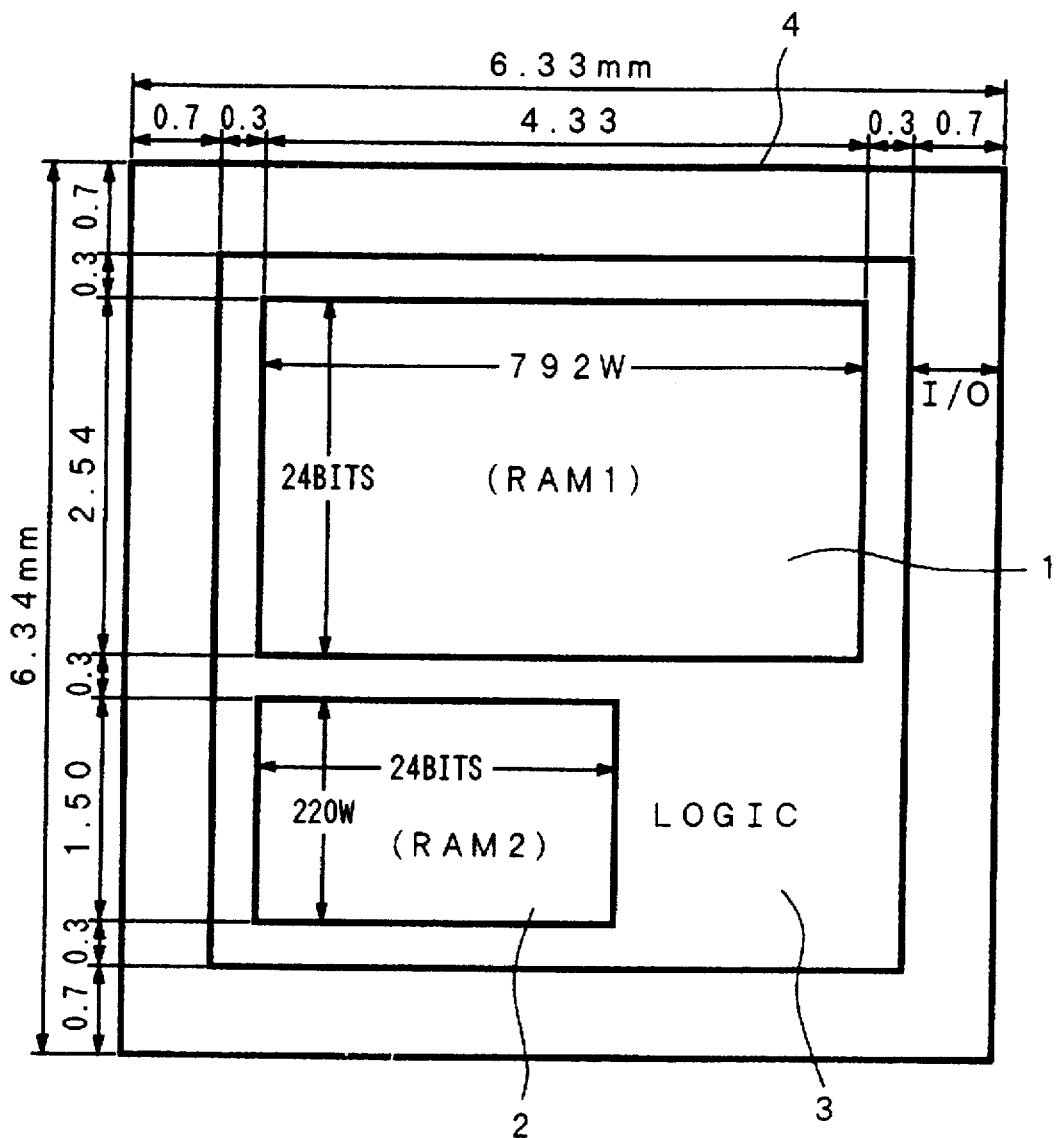
FIG. 4 is an enlarged plan view showing placement of IC memory according to an embodiment of the invention on a chip.
Figure 7:
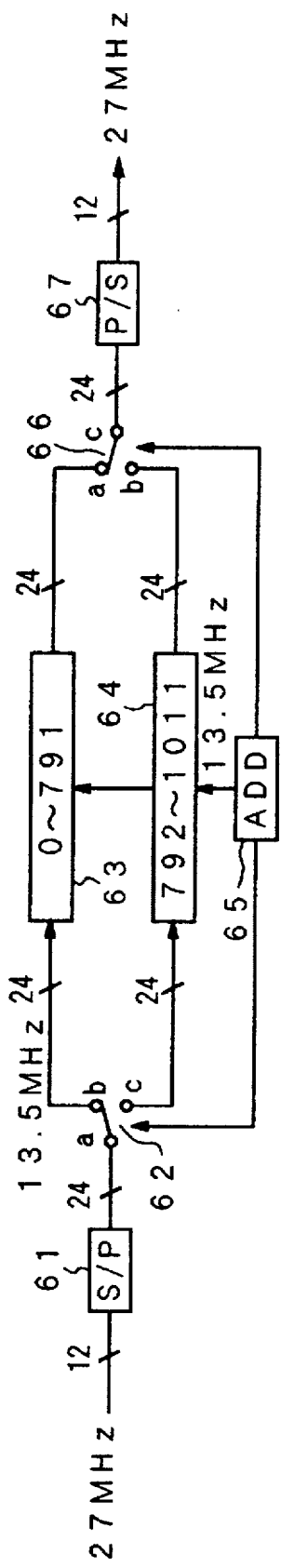
FIG. 7 is a block diagram for explaining an embodiment of the invention.

When the construction of FIG. 6C is actually made on a chip in the location as shown in FIG. 4, its circuit arrangement can be illustrated as shown in FIG. 7. That is, when the memory is formed on the chip, memory portions 44 and 46 of FIG. 6C are joined into 24 bits and memory portions 45 and 47 into 24 bits because it is known that a larger bit width is more advantageous (see FIGS. 3A to 3D).

In FIG. 7, a digital signal with the sampling frequency 27 MHz is supplied to an input terminal a of a switch 62 through a serial/parallel converting circuit 61. Output from an output terminal b of a switch 62 is supplied to RAM 63. Output from an output terminal c of the switch 62 is supplied to RAM 64. An address signal from an address generating circuit 65 is supplied to RAM 63 and RAM 64, and a control signal from the address generating circuit 65 is supplied to switches 62 and 66.

Output from RAM 63 is supplied to a parallel/serial converting circuit 67 through terminals a–c of a switch 66. Output from RAM 64 is supplied to the parallel/serial converting circuit 67 through terminals b–c of the switch 66. A delayed digital signal is taken out from the parallel/serial converting circuit 67.

Figure 8:
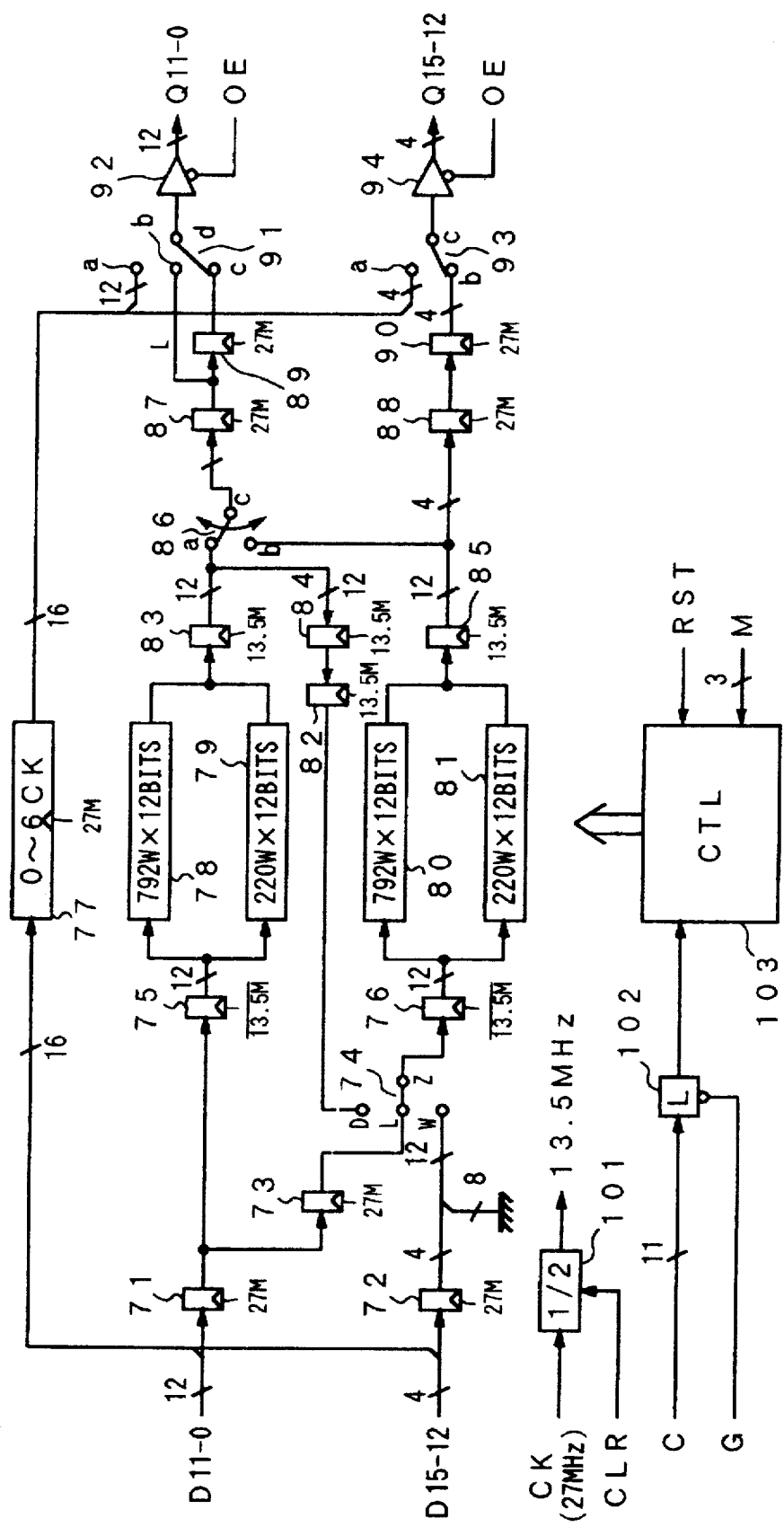
FIG. 8 is a block diagram of an embodiment of the invention.

FIG. 8 shows a more specific circuit arrangement corresponding to the construction of FIG. 6C. As shown in FIG. 8, the circuit may be considered to have two 1-port RAMs of (792+220)w×12 bits. However, it should be taken into consideration upon designing the circuit that addresses of these two RAMs are always identical, changeover between 0–791 and 792–1011 is necessary, and writing and reading cannot be concurrent because the RAMs are 1-port RAMs.

In FIG. 8, numerals 78 and 80 denote RAMs of 792w×12 bits, and 79 and 81 are RAMs of 220w×12 bits. A 12-bit digital signal is supplied to a register 71 and to a delay circuit 77. A 4-bit digital signal is supplied to a register 72 and to the delay circuit 77. Output from the delay circuit 77 is supplied to an input terminal a of a switch 91 and to an input terminal a of a switch 93.

Output from the register 71 is supplied to RAM 78 and RAM 79 via a register 75 and to an input terminal L of a switch 74 through a register 73. Output from the register 72 is supplied to an input terminal W of a switch 74. The input terminal W of the switch 74 is also supplied with a 12-bit digital signal of which four bits are supplied from the register and the remaining eight bits are grounded.

Outputs from RAM 78 and RAM 79 are supplied to a register 83. Output from the register 83 is supplied to an input terminal D of the switch 74 through registers 84 and 82. Output from an output terminal Z of the switch 74 is supplied to RAM 80 and RAM 81 via a register 76. Outputs from RAM 80 and RAM 81 are supplied to a register 85. Output from the register 85 is supplied to an input terminal b of the switch 86 and to an input terminal b of the switch 93 through registers 88 and 90.

Output from an output terminal c of the switch 86 is supplied to a register 87. Output from the register 87 is supplied to an input terminal c of the switch 91 via a register 89 and to an input terminal b of the switch 91. Output from an output terminal d of the switch 91 is supplied to a buffer 92. Output from an output terminal c of the switch 93 is supplied to a buffer 94. Delayed digital signals are taken out from the buffers 92 and 94. Outputs from the buffers 92 and 94 can be processed to have a high impedance by using an output-enable signal OE.

A clock CK and a clear signal CLR are supplied to a ½ dividing circuit 101. A parallel input C (G is its latch pulse) is supplied to a control circuit 103 through a latch circuit 102. A pulse input (variable with period) RST and a mode setting signal M are supplied to the control circuit 103. Outputs from the ½ dividing circuit 101 and the control circuit 103 are supplied to RAMs 78, 79, 80 and 81, respectively.

The circuit of FIG. 8 is operative in LONG, DOUBLE and WIDE modes, depending on states of connection of switches 74, 86, 91 and 93. Hereafter are explained control terminals common to all modes. Clock CK normally enters at the frequency twice the data rate in all times other the LONG mode, and the phase of the clock CK when divided into ½ is determined by the clear signal CLR. The amount of delay is determined by the parallel input C (G is its latch pulse) and the pulse input (variable with period) RST. Selection thereof and setting of three modes are effected by M.

Figure 9:
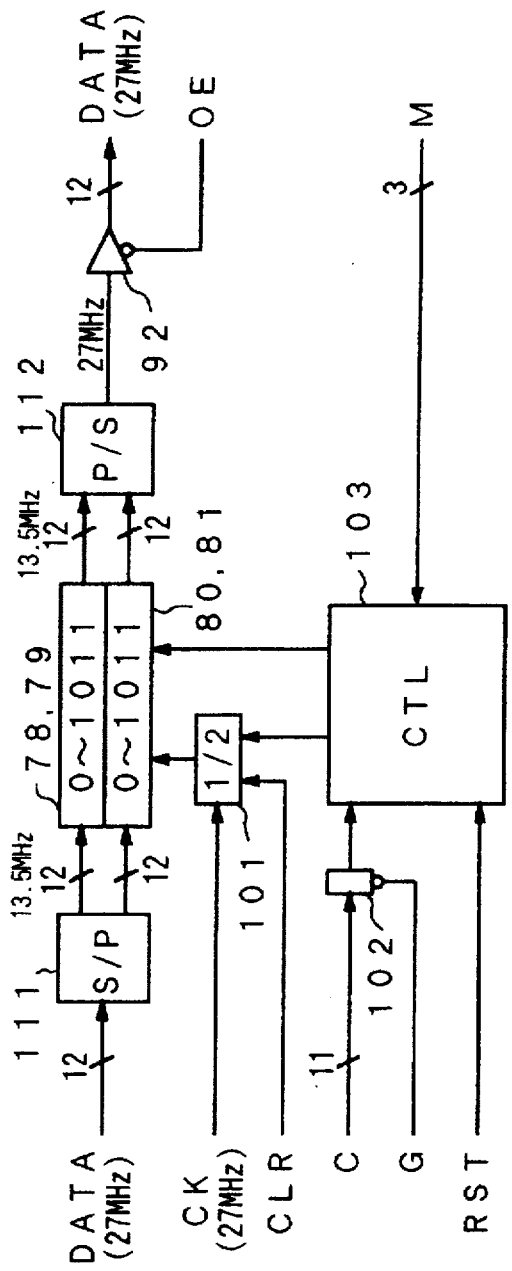
FIG. 9 is a block diagram used for explaining operations in the LONG mode of the construction of FIG. 8.

Respective modes of the embodiment of the invention are explained below with reference to FIGS. 9 to 11. FIG. 9 shows the aspect in the LONG mode. In FIG. 9, the digital signal with the sampling frequency of 27 MHz is supplied to RAMs 78 through 81 via the serial/parallel converting circuit 111. Outputs from RAMs 78 through 81 are supplied to the buffer 92 via the parallel/serial converting circuit 112. A delayed digital signal is taken out from the buffer 92.

In the LONG mode shown in FIG. 9, data entering at the clock rate of 27 MHz is converted to data of 13.5 MHz by the serial/parallel converting circuit 111, and writing/reading is effected at this rate on RAMs 78 and 79 and RAMs 80 and 81, simultaneously and respectively. Data read out from RAMs are returned back to the rate of 27 MHz by the parallel/serial converting circuit 112. At this time, since writing/reading addresses are the same, the amount of delay is variable up to 2023 clocks with a period of the addresses.

Since a delay occurs due to the serial/parallel converting circuit 111 at the input and output control portions, an additional bypass route is provided for removing it during a delay of 0 clock to 6 clocks in order to ensure the small minimum delay as stated above.

Figure 10:
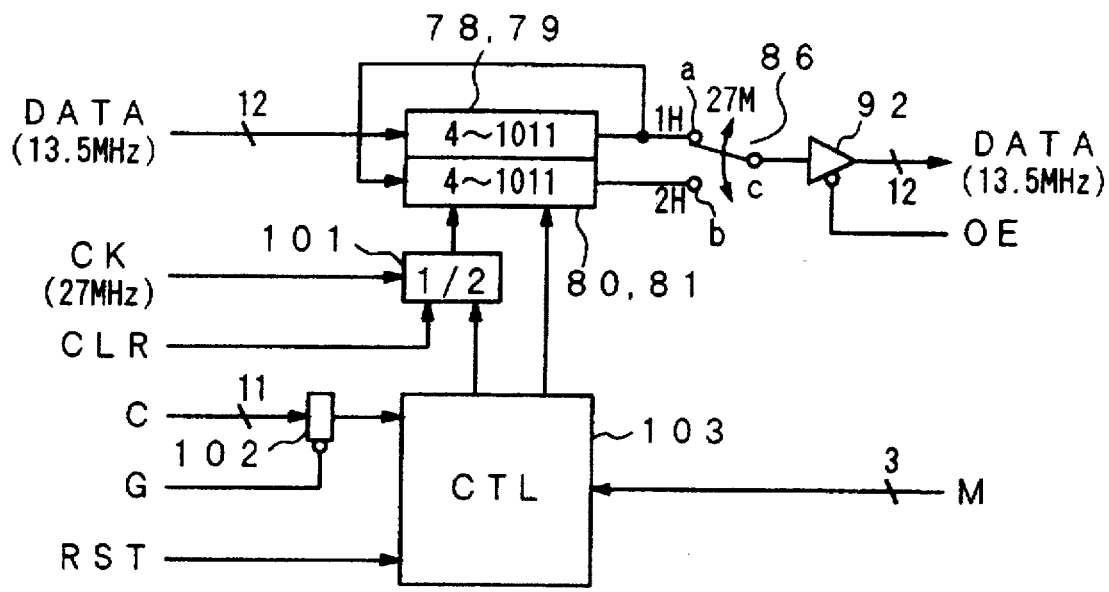
FIG. 10 is a block diagram used for explaining operations in the DOUBLE mode of the construction of FIG. 8.

FIG. 10 shows the aspect in the DOUBLE mode. In FIG. 10, the digital signal with the sampling frequency of 13.5 MHz is supplied to RAM 78 and RAM 79. Outputs from RAM 78 and RAM 79 are supplied to the input terminal a of the switch 86 and to RAMs 80 and 81. Outputs from RAMs 80 and 81 are supplied to the input terminal b of the switch 86. Output from the output terminal c of the switch 86 is supplied to the buffer 92. A delayed digital signal is taken out from the buffer 92.

The DOUBLE mode shown in FIG. 10 is a mode in which 1H/2H multiplex outputs are obtained (where H is 63.5 μsec in one horizontal scan period). In this mode, RAMs 78 and 79 delay the data entered at the clock rate of 13.5 MHz by 1H, RAMs 80 and 81 delay the same entered data by 2H, and these 1H-delayed data and 2H-delayed data are alternately output at the rate of 27 MHz. At this time, the minimum amount of delay is four clocks.

Figure 11:
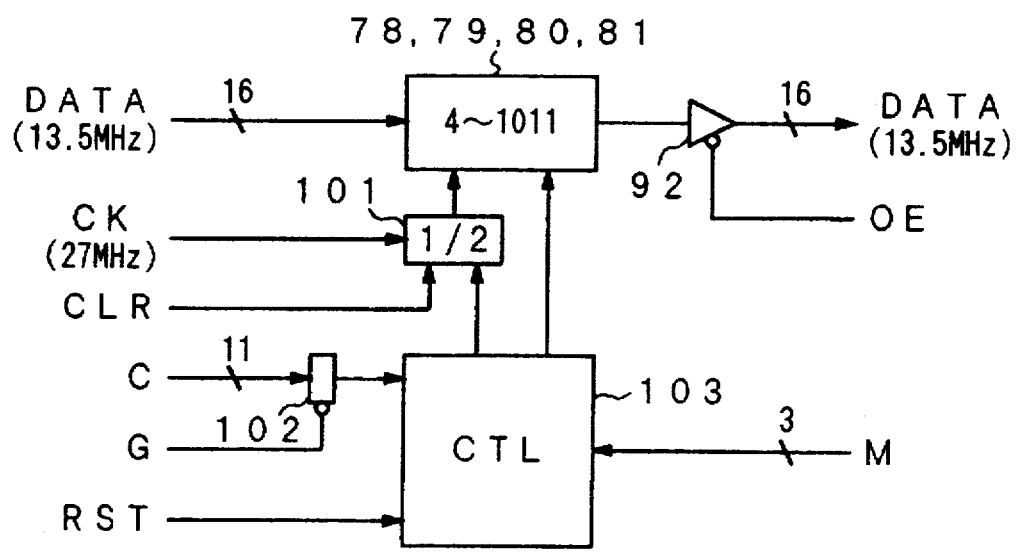
Fig. 11 is a block diagram used for explaining operations in the WIDE mode of the construction of FIG. 8.

FIG. 11 shows the aspect in the WIDE mode. In FIG. 11, the digital;signal with the sampling frequency of 13.5 MHz is supplied to the buffer 92 through RAMs 78 to 81. A delayed digital signal is taken out from the buffer 92. In the WIDE mode shown in FIG. 11, 16-bit data entering at the clock rate of 3.5 MHz can be delayed up to 1011 clocks by RAMs 78 to 81. In this case, the minimum delay amount is four clocks.

The IC memory according to the invention can be realized on a chip of a size necessary and sufficient for a desired memory capacity, and can therefore be small-scaled and inexpensive. Additionally, since the IC memory is made of a plurality of divisional memory portions, absolutely different memory circuits can be realized simultaneously by appropriate changeover of input output portions. Further, the scheme of the invention also makes it possible to create devices that have been considered impossible heretofore.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. An IC memory having a capacity determined by a word length and a bit width of data to be stored therein, said IC memory comprising:

a chip having an effective chip size defined by a length L1 in a first direction and a length L2 in a second direction; and a first memory portion and a second memory portion disposed on said chip, said first memory portion having a first word length portion not larger than said length L1 and having said bit width extending in said second direction, said second memory portion having said bit width extending in said first direction and having a second word length portion extending in said second direction, wherein a sum of said bit width and said second word length portion is less than said length L2, and a sum of said first word length portion and said second word length portion is substantially equal to said word length of said data to be stored.

2. The IC memory according to claim 1, further comprising means for providing a delaying IC.

3. The IC memory according to claim 2, wherein said length L1 is substantially equal to said length L2.

4. The IC memory according to claim 3, further comprising switching means connected at data input and output portions of said IC memory, and control means for controlling generation of addresses of said first and second memory portions, and for controlling writing and reading on and from said first and second memory portions.

5. An IC memory having a capacity determined by a word length and a bit width of data to be stored therein, said IC memory comprising:

a chip having an effective area less than an actual area of said chip; and a plurality of memory portions each having a size in accordance with an allocated one of a plurality of regions in said effective area of said chip, wherein said chip having a substantially square shape, said plurality of memory portions has respective word length portions, and a sum of said respective word length portions is substantially equal to said word length of said data to be stored.

6. The IC memory according to claim 5, wherein said plurality of memory portions have said capacity as a whole such that a data writing/reading operation of said IC memory proceeds continuously.

\* \* \* \* \*